United States Patent [19]

Lewis

[11] 4,037,219

[45] July 19, 1977

[54] METER DIAL ENCODER FOR REMOTE METER READING

[75] Inventor: Arthur M. Lewis, Pittsburgh, Pa.

[73] Assignee: Westinghouse Electric Corporation, Pittsburgh, Pa.

[21] Appl. No.: 645,165

[22] Filed: Dec. 30, 1975

[51] Int. Cl.² ........................................... G08C 19/16
[52] U.S. Cl. ............................ 340/204; 250/231 SE; 340/188 R; 340/190; 340/201 P; 340/347 P
[58] Field of Search ..................... 340/206, 190, 201 P, 340/310 A, 347 P, 204, 188 R, 188 CH; 250/231 SE; 346/14 MR

[56] References Cited

U.S. PATENT DOCUMENTS

| 3,376,567 | 4/1968 | Brothman et al. | 340/347 P |
|---|---|---|---|
| 3,484,780 | 12/1969 | Kamoi et al. | 340/347 P |
| 3,806,875 | 4/1974 | Georget | 340/380 |
| 3,815,126 | 6/1974 | Batz | 340/347 P |
| 3,846,788 | 11/1974 | Calabro et al. | 340/347 P |
| 3,846,789 | 11/1974 | Germer et al. | 340/347 P |

Primary Examiner—John W. Caldwell
Assistant Examiner—James J. Groody
Attorney, Agent, or Firm—R. W. Smith

[57] ABSTRACT

A meter dial encoder for converting angular dial pointer shaft positions includes a single track code pattern having binary coded arcuate sectors rotated by the shaft. The pattern is rotated adjacent a pattern sensing assembly including a single circular row of sensing positions having associated sensors for producing a multiple bit binary code signal. The code signal is changed by only one bit for each arcuate pattern movement equal to one arcuate sector. Each shaft position is converted from a corresponding dial reading to a binary code signal having error checking capability. In one preferred form of the invention, an opto-electronic encoder includes a single illuminating source and a light guide arrangement to produce plural point light sources for each of plural light responsive sensors associated with each of the sensing positions. An alternative light guide arrangement optically couples each of the sensing positions to light sensors. In a further preferred form of the invention, a code pattern is a magnetic field controlling material and is rotated adjacent a magnetic sensor for producing the shaft position binary code signal.

4 Claims, 11 Drawing Figures

METER DIAL ENCODER FOR REMOTE METER READING

BACKGROUND OF THE INVENTION

This invention relates to encoders for meter dials for use in remote meter reading systems, and more particularly to meter dial registers of the multi-dial type having a binary encoder including a single track code pattern and pattern sensing assembly with a single row of sensing positions for converting the angular positions of the register pointer shafts to a binary code signal in a suitable form for telemetering the meter reading to a remote location.

It is well known to provide utility meters having gear-driven registers of the dial type with encoding arrangements for converting the dial shaft positions to a binary code. Meter registers equipped with encoders provide a convenient way to convert the dial readings of existing utility meters to signals linked to a remote meter reading system with the registers still being usable in the conventional mode for providing visual readings. The binary encoded or digitized meter reading signals can be compared to the register dial readings to check if there is any error in the encoder signals. Also, in the event of a malfunction of the encoder or the associated remote meter reading telemetry system, there remains the normally provided dial readings to determine the billing of a utility customer.

Examples of prior art meter dial encoders of a similar type to which the present invention pertains are disclosed in U.S. Pat. Nos. 2,067,098, 3,310,801, 3,806,875, 3,846,788, 3,846,789 and 3,683,368. The aforementioned patents disclose encoders for electric utility meter registers for use in conventional watthour meters connectable to a remote meter reading system. Generally, registers included in the aforementioned patent references have four or five decade dials, each with a shaft-driven pointer. A code pattern and a pattern sensing device is associated with each of the pointer shafts. Either the pattern or the sensing device is movable in response to the meter indicating movement of the shaft. Typically, optical or contact wiper type of arrangements are provided in the encoder code pattern and sensor systems. One difficulty in the wiper arrangements is that the coded conductive segments are subjected to continuous wear by a brush wiper which alternately develops conductive and non-conductive sensor signals. The optical arrangements generally include reflective or apertured coded segments and associated radiation or light sources directed at the coded segments. A complementary radiation or light sensing arrangement is optically aligned with the segments. U.S. Pat. No. 3,806,875 discloses bundles of optical fibres for transmitting light to and from coded tracks of drums driven by the shaft of a measuring device. Difficulties presented in the optical arrangements include the precision manufacture of accurate code segments in or on usually very small discs. Also, these code discs must be precisely mounted or the register pointer shafts in precise orientations which will not slip relative to the shafts. The optical light sources and sensing arrangements must be precisely mounted within the registers adjacent the code discs. Electrical and electronic circuitry must be further mounted therein to produce the desired scanning and output arrangements of the sensors to develop binary code signals from the meter.

In addition to the aforementioned considerations, the encoders must be extremely rugged and reliable and operable at widely varying temperature and ambient conditions consistent with the normally designed extended use features of utility meters. The size and complexity of encoders are limited by the size and complexity of the registers. Gear train mechanisms are included in the registers in relatively small and compact spaces to produce the ten to one ratios between the register decade dials. It is necessary to provide the code patterns so that there is capability of interdial interpretation for determining the pointer position of one dial relative to the adjacent next less significant dial reading just as such interpretations are required upon visual reading of the dials. Further, it is desirable that there be a provision for detecting when an error occurs in the coded meter reading signals. It should be understood that the complexity of the code patterns increase as the resolution or amounts of shaft angular movement increases in accuracy to produce a different and unambiguous signal. The aforementioned considerations in meter register encoders are generally understood by those skilled in the art and are noted in the above-identified prior patents.

SUMMARY OF THE INVENTION

A meter register encoder for remote meter reading made in accordance with the present invention includes a single track code pattern formed in a ring of binary coded sectors. The single path of the code pattern includes plural arcuate sectors representing either a binary one or binary zero coded indicia. The sectors are defined by open space or slot areas and contrasting solid or opaque areas of a plate fixed to a register pointer shaft. Two continuously open arcuate segment areas are separated by two continuously solid arcuate segment areas including predetermined numbers of equal arcuate sectors as defined by rotation of the code pattern adjacent the sensors. A pattern sensing assembly includes a sensor assembly having a group of five sensing positions around the pointer shaft and adjacent one side of a code plate. The five sensing positions are equally circumferentially disposed in alignment with the code pattern. Sensors associated with each of the sensing positions produce a different five-bit binary code signal in response to the rotation of the pointer shaft through the arcuate extent of each sector. Each of the 20 different binary encoded shaft positions produce a binary signal including two bits of one binary state and three bits of an opposite binary state defining a two-or-three-out-of-five code, with a single bit being changed with each sequentially progressive change during rotation of code pattern.

In an alternative embodiment of this invention, a magnetic code plate and magnetic sensors are used. The sensors are located at the sensing positions and the configuration of the magnetic plate includes the single track code pattern in accordance with the present invention.

In the one preferred embodiment, an opto-electronic encoder includes an optical pattern sensing assembly including a light assembly having a single illuminating source and a single light guide plate. A group of five point light sources is formed by recess surfaces in the light guide plate in alignment with the five sensing positions which are at an opposite side of a code disc plate from the light guide plate. Light sensors are provided at each of the sensing positions to have either of two electrical state outputs in response to the positioning of either a slot or opaque sector of the code disc between a point light source of stimulation for an associated light sensor. In another embodiment of this invention, an alternative light assembly includes five separate light guides wherein each light guide includes point light sources for each of corresponding point light source positions of a different dial code patterns. An alternative sensor assembly includes a separate light guide for each sensor position. The five sensor positions associated with each sensor pattern are coupled to a single light sensor.

An optical sensing control circuit for the last described embodiment includes a clock pulse source and two counter circuits controlled by the clock pulse source for sequentially activating the five lamps as the first counter advances through five output states. The second counter sequentially activates each of the light sensors associated with each separate dial after each cycle in which the five lamps are activated. Error checking is available by detection of the two-or-three-out-of-five code for each binary code output. A lamp checking feature includes a single lamp checking light sensor which is optically coupled to each of the five lamps by five light guides. Two additional intervals are added to the meter reading code in a scanning cycle of the control circuit. The checking bit intervals are controlled by the optical sensing control circuit so that during different intervals either all of the light sources will be on or all of the light sources will be turned off so that the checking light sensor will produce opposite binary outputs.

It is a general feature of this invention to provide a meter dial encoder for remote meter reading in which the encoder has a simple single track code pattern for producing different binary code signals which produce unambiguous interdial interpretation. It is another important feature of the present invention to provide a simple and flexible light assembly for producing a predetermined pattern of point light sources from a single illuminating source utilizing light guide arrangements to permit compact and inexpensive manufacturing designs. A still further feature of the present invention is to provide a code pattern in combination with a pattern sensing assembly which is capable of error detection in the binary codes produced and to further provide checking of the sensing elements provided in the pattern sensing assembly. These and other features of the present invention will be apparent from a description of the drawings which are briefly described hereinafter.

DETAILED DESCRIPTION OF THE PREFERRED EMBODIMENTS

Figure 1:
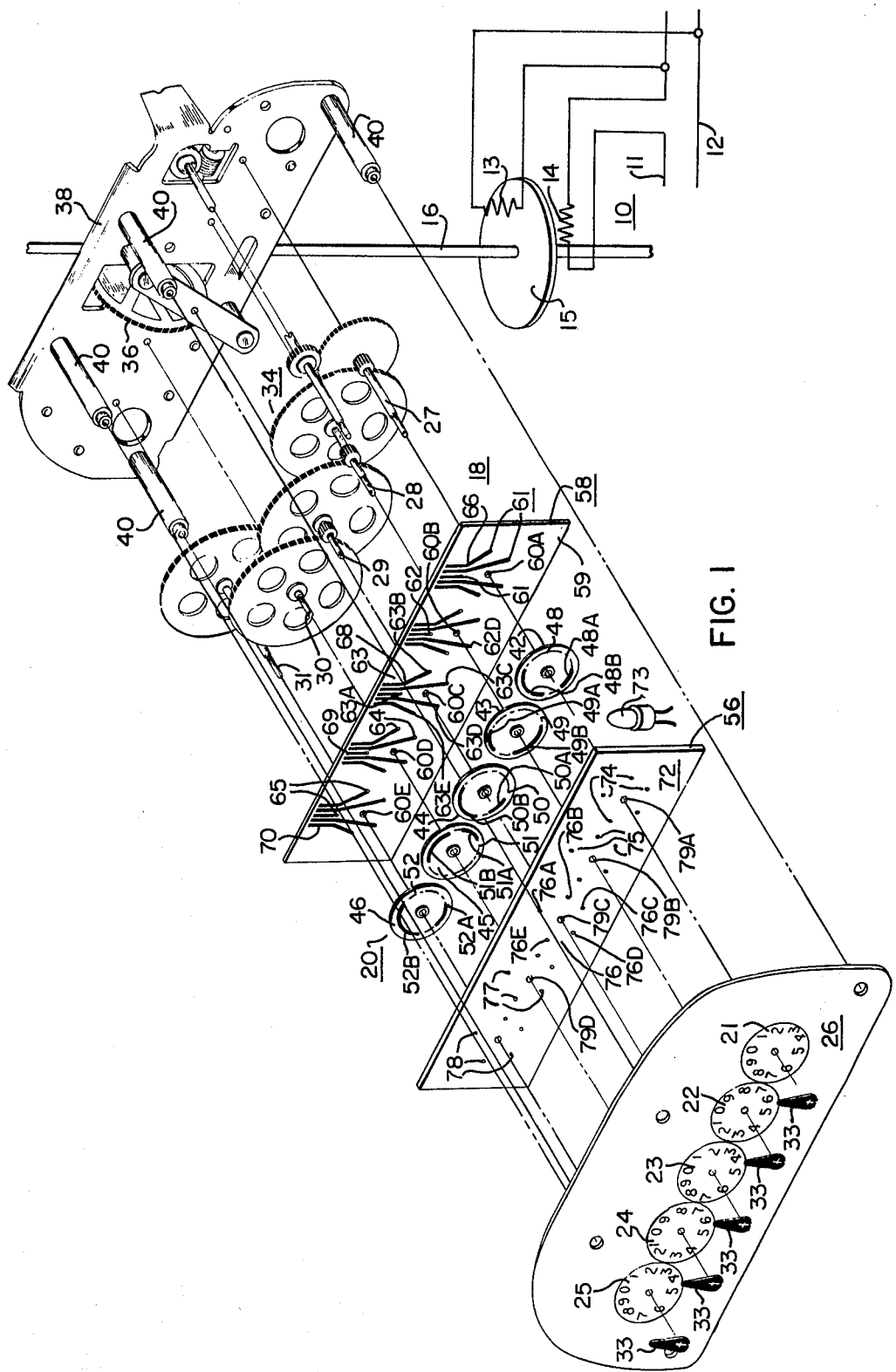
FIG. 1 is an exploded view of a meter dial register including an encoder for remote meter reading made in accordance with the present invention.

Referring now to the drawings, and more particularly to FIG. 1, there is shown a measuring device formed by a watthour meter 10 of the type installed at electric utility customers. The meter 10 measures the quantity of electrical energy flowing through conductors 11 and 12 by connecting the meter voltage and current coils 13 and 14 thereto. A meter disc 15 and associated shaft 16 are electromagnetically driven by the coil magnetic fluxes in a well known manner.

A dial register 18 of the meter 10 is shown in an exploded view including one preferred embodiment of an encoder 20 for remote meter reading made in accordance with the present invention.

Figure 3:
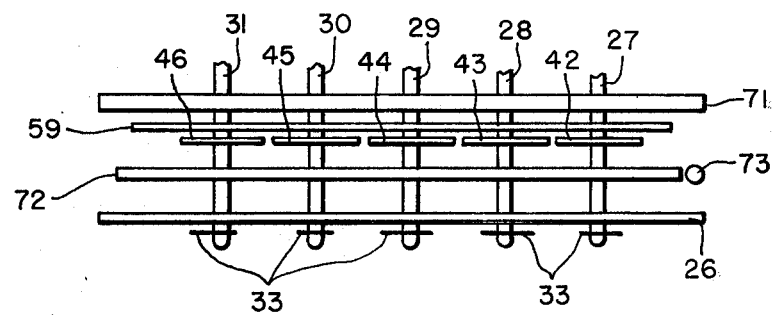
FIG. 3 is a top plan view of a forward portion of the register shown in FIG. 2.

The register 18 is of the multi-dial continuously gear-driven type having five decade dials 21, 22, 23, 24 and 25 for indicating numerical meter readings of the measured kilowatt hours produced by the metering movement of the meter 10. Numerals 0 through 9 define each of the dials on a dial plate 26. The numerals are progressively ascending in a clockwise direction on dials 21, 23, and 25 and in a counterclockwise direction on dials 22 and 24 in a conventional manner for utility meter registers. Dials 21, 22, 23, 24 and 25 correspond to units, tens, hundreds, thousands, and ten thousands readings, respectively, or predetermined multiples thereof, of the kilowatthour energy consumption measured by the watthour meter 10. Pointer shafts 27, 28, 29, 30 and 31 have forward ends which extend through the dial plate 26 at the centers of the dials 21, 22, 23, 24 and 25, respectively. Pointers 33 are carried on the forward ends of each pointer shaft as shown in FIG. 3. The rear end of the pointer shafts 27, 28, 28, 30 and 31 carry gears of a gear train system 34, which drives the shafts in a progressively increasing 10-to-one ratio in response to rotation of a worm wheel 36 meshing with a worm gear, not shown, on the meter shaft 16. The gear train system 34 is mounted between the dial plate 26 and a backplate 38 which is detachably mounted to the frame (not shown) of the watthour meter 10. Four spacer studs 40 fixedly mount the dial plate 26 to the backplate 38 when the stud ends are riveted. The studs 40 and pointer shafts are made slightly longer than in standard registers to accommodate the encoder 20. The register 18 is otherwise identical to a standard watthour meter register not including the encoder 20.

Figure 2:
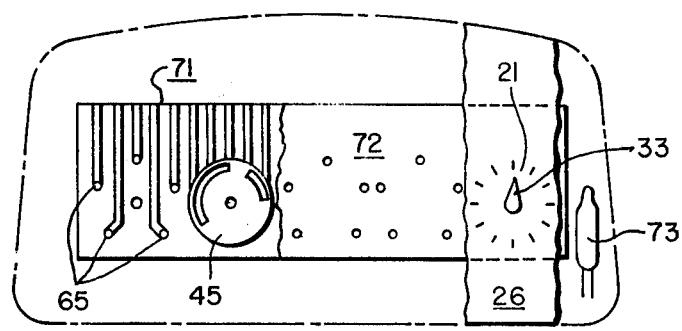
FIG. 2 is a front plan view with parts broken away of the meter register shown in FIG. 1.

Referring now more paticularly to the encoder 20 included in the register 18, which is shown in the exploded view of FIG. 1 and also in FIGS. 2 and 3. The encoder 20 converts the angular positions of each of the continuously driven pointer shafts 27, 28, 29, 30 and 31 into a five-bit binary code representing the meter reading indicated by the pointers 33 of the associated dials 21, 22, 23, 24 and 25, respectively. The encoder 20 generally includes code plates 42, 43, 44, 45 and 46 having a disc configuration and including single track code patterns 48, 49, 50, 51 and 52. The plates 42, 42, 44, 45 and 46 are fixed for rotation on the shafts 27, 28, 29, 30 and 31, respectively. These patterns are identical with respect to each of the associated dials 21, 22, 23, 24 and 25 and include arcuate slots 48A and 48B, 49A and 49B, 50A and 50B, 51A and 51B and 52A and 52B, as described further in connection with the description of FIG. 4 except that the code patterns 49 and 51 are reversed because of the reversed rotation of the associated shafts. A pattern sensing assembly 54 in FIGS. 1, 2 and 3 is of an opto-electronic type including a light assembly 56 providing light stimulation sources for an optical sensor assembly 58.

The sensor assembly 58 includes a printed circuit board 59 mounted on one side of the code plates wherein the circuit board has five holes 60A, 60B, 60C, 60D and 60E for receiving the pointer shafts 27, 28, 29, 30 and 31. Surrounding equidistantly from the holes 60A, 60B, 60C, 60D and 60E are five groups 61, 62, 63, 64 and 65, respectively, of radiation or light responsive sensors of the solid state photodiode type. Five sensors in each group are equally circumferentially spaced at the sensors 63A, 63B, 63C, 63D and 63D are in the sensor group 63. The sensors are at locations defining sensing positions oriented in alignment with the single circular track of the code patterns carried by the code plates. Five groups of printed circuit conductors 66, 67, 68, 69 and 70 electrically connect associated light responsive sensors to an electronic circuit package 71, shown in FIG. 2.

The light assembly 56 includes a light guide plate 72. The plate 72 is made of a light conducting material which is well known which includes a transparent material which is characterized as having a noncollimated light exposed at one edge and internally reflecting the light impinging on the edge since it has an index of refraction greater than that of air. The boundaries of the material forming the light guide plate substantially totally reflect the light unless the angle of incidence of the light is less than the critical angle, in which case the light escapes through the surface of the material. Accordingly, an illuminating source 73, formed, for example, by an incandescent or neon lamp or light emitting diode (LED) positioned at an edge of the light guide plate 72. Groups of point light sources 74, 75, 76, 77, and 78 are formed around each of the holes 79A, 79B, 79C, 79D and 79E formed in the plate 72 to receive the pointer shafts 27, 28, 29, 30 and 31. The light guide plate 72 is on the opposite side of the code plates from the sensors. The point light sources of each group are formed by dimpled or recessed surfaces extending into the side of the plate 72 at an angle which permits light to escape therefrom. Thus, sources of light stimulation are formed for the light sensors. For example, the point light sources 76A, 76B, 76C, 76D and 76E of the group 76 in the light guide plate direct light through the side of the light guide plate to the sensors 63A, 63B, 63C, 63D and 63E. The point light sources of each group are equally circumferentially spaced and aligned with a corresponding group of light sensors having sensor positions at the same radial and circumferential locations relative to an associated single track code pattern.

FIGS. 2 and 3 illustrate the front and top partial views of the register 18 as it is assembled together. Parts are broken away in FIG. 2 to better illustrate the relative positioning, along the axis of the pointer shafts, of the dials, the point light sources, the code plates and the sensor assembly shown in the exploded view of FIG. 1. Correspondingly, FIG. 3 shows the register encoder parts as viewed from the top of the register.

Figure 4:
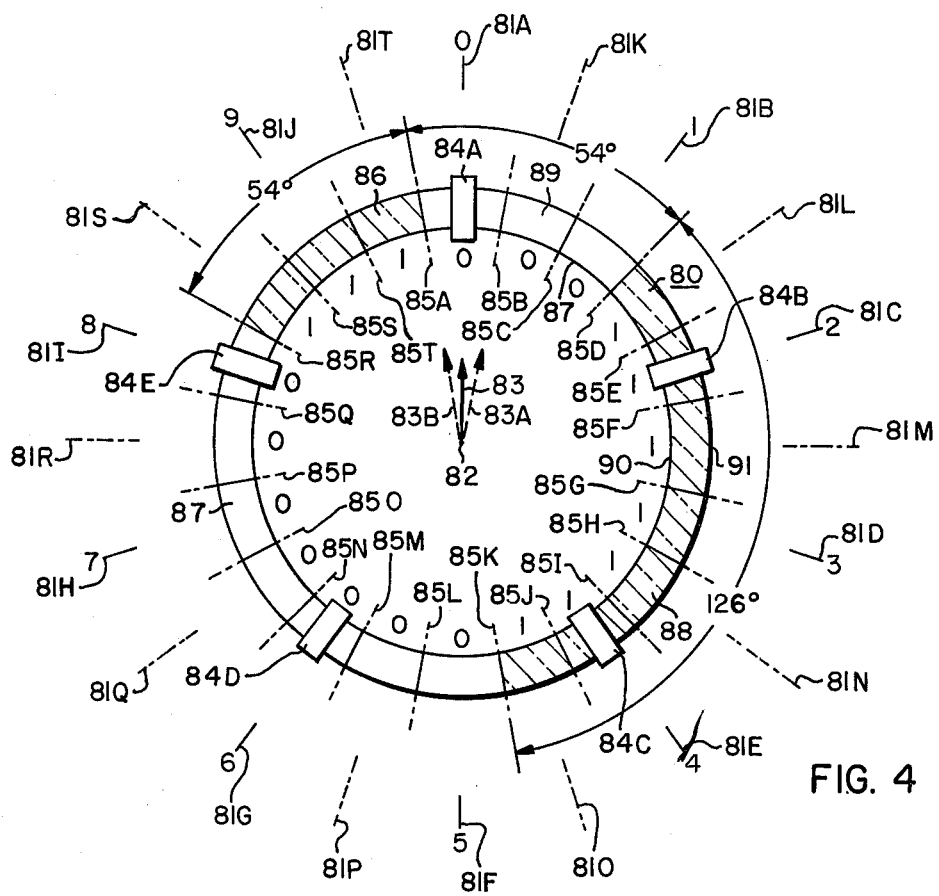
FIG. 4 is a schematic diagram illustrating the encoder code pattern and sensing positions arranged in accordance with this invention relative to an associated dial and dial pointer.

Referring now to FIG. 4, there is illustrated a diagrammatic layout of an exemplary code pattern 80 utilized in the preferred embodiments of the present invention. A typical stationary register decade dial is represented by the numeral markings 0 through 9 at the outer periphery of FIG. 4. The numerals are equally circumferentially spaced in a clockwise ascending numerical order as are the dials 21, 23 and 25. Accordingly, the numeral markings 0 through 9 are positioned along the equally arcuately spaced radial reference lines 81A through 81J, respectively, extending from the center of the dial and spaced every 36°. Radial reference lines 81K, 81L, 81M, 81N, 81O, 81P, 81Q, 81R, 81S and 81T are shown half way between the dial numerals for purposes of explanation as described further therein below.

The center of the dial in FIG. 4 includes exemplary pointer shaft 82 and a pointer 83 rotatable in a clockwise direction as the shafts 27, 29 and 31 are in response to the measuring movement of the watthour meter 10 shown in FIG. 1. A group five stationary sensing positions 84A, 84B, 84C, 84D and 84E are aligned radially with the code pattern 80 and are equally circumferentially spaced 72° apart as the sensors are in the groups 61, 62, 63, 64 and 65. Accordingly, the sensing positions are shown aligned with the reference lines 81A, 81C, 81E, 81G and 81I.

The code pattern 80 is continuously rotated with the pointer shaft 82 and pointer 83 and extends in a single circular track or ring having four arcuate segments 86, 87, 88, and 89 defining 20 binary coded sectors extending in circular arc sectors of 18° each representing indicia of either of two binary conditions when rotated adjacent the five sensing positions. The indicia sectors are defined between the radial reference lines 85A through 85T and between the inner and outer circular lines 90 and 91 which define the single track or ring of the pattern 80. The indicia sectors are coded to develop, by altering an exciting or stimulating source, two different responses or levels of modulation in an electrical sensor when aligned with an associated sensing position. The arcuate areas including alternate solid and broken lines indicate binary one coded indicia and the arcuate areas of solid crossed lines represent the binary zero coded indicia. In the optical type encoder 20 of this invention the binary indicia sectors are either transparent or opaque to represent a binary one or binary zero when positioned immediately adjacent a light responsive sensor. For example, in the register 18 the indicia sectors of the code plates 42 through 46 have the aforementioned arcuate slots to produce a binary one. The material of the plate between the point light sources and the light sensors along the code track produces a binary zero when positioned adjacent one of the five light responsive sensors. The binary one coded sectors can also be formed by removing the material of the code plate in the form of arcuate or pie-shaped cutouts having radial sides extending along predetermined ones of the reference lines 85A through 85T, for example between the lines 85D and 85K and between lines 85A and 85R, to the perimeter of a plate including the pattern. It is to be understood that alternative coded sectors may be provided, such as by providing the indicia sectors of a reflecting and nonreflecting surface. It is further noted that a magnetic pattern sensing assembly is described hereinbelow in connection with the description of FIGS. 5, 6 and 7.

Referring now more particularly to the specific arrangement of the code pattern 80, the pattern is described beginning with the reference line 85A. Three consecutive binary one sectors extend for 54° in a counterclockwise direction between the reference lines 85A and 85R, seven consecutive binary zero indicia sectors extend 126° between lines 85R and 85K, seven consecutive binary one indicia sectors extend a further 126° between lines 85K and 85D and three consecutive binary zero sectors extend for 54° between lines 85D and 85A to provide a total of 20 indicia sectors in the 360° extent of the code pattern 80. Accordingly, there are defined four different pattern segments in which the first, beginning with line 85A, includes three binary ones, the second includes three binary zeroes, the third includes seven binary ones, and the fourth includes seven binary zeroes. With the code pattern 80 rotating through 360°, 20 different five bit binary code signals are generated for each arcuate movement of 18° of the pointer shaft 83 or the arcuate distance of one indicia sector. It is noted that the code pattern 80 is oriented on the shaft 82 so that when the pointer 83 points toward the numeral 0, indicia sectors are centered with the sensing positions. Accordingly, the pattern reference lines 85A through 85T are arcuately offset 9° between the dial reference lines upon each occurrence that the pointer 83 is aligned with a dial numeral marking.

Twenty different codes of five bits are the minimum number of code bits necessary to permit interdial interpretation and therefore provide an unambiguous interpretation of the rotation of a dial pointer relative to decade dial number markings. The consecutive change in the binary code relative to an adjacent code as the pattern is rotated involves only the change in one bit, as is well known in the gray or reflected binary code. This is advantageous because associated encoding apparatus can be arranged to prevent an output of a spurious, out-of-sequence code. All of the codes have at least two binary zeroes and two binary ones and can be described as a two-or-three-out-of-five code. This code format further provides the capability of rejecting an erroneous code output. The remaining unused five bit codes available from the total of 32 codes all have at least four binary ones or four binary zeroes.

The Code Conversion Table listed hereinbelow includes two headings designated Dial Binary Codes and Decade Dial Reading, the latter indicating the dial readings corresponding to the encoder codes under one of two columns designated Low and High. The interpretation for a given dial depends upon the interpretation of the next less significant dial, just as with a human reading. If the next less significant dial reading lies in the range from 5 to 9, the Low column under the Decade Dial Reading is used. If the next less significant dial reading lies in the range 0 to 4, the High column is used.

CODE CONVERSION TABLE

| DIAL BINARY CODES | DECADE DIAL READING | |
|---|---|---|
| | Low | High |
| 1 1 1 0 0 | 0 | 0 |
| 1 0 1 0 0 | 0 | 1 |
| 1 0 1 1 0 | 1 | 1 |
| 0 0 1 1 0 | 1 | 2 |
| 0 1 1 1 0 | 2 | 2 |
| 0 1 0 1 0 | 2 | 3 |
| 0 1 0 1 1 | 3 | 3 |

-continued
CODE CONVERSION TABLE

| DIAL BINARY CODES | DECADE DIAL READING | |
|---|---|---|
| | Low | High |
| 0 0 0 1 1 | 3 | 4 |
| 0 0 1 1 1 | 4 | 4 |
| 0 0 1 0 1 | 4 | 5 |
| 1 0 1 0 1 | 5 | 5 |
| 1 0 0 0 1 | 5 | 6 |
| 1 0 0 1 1 | 6 | 6 |
| 1 0 0 1 0 | 6 | 7 |
| 1 1 0 1 0 | 7 | 7 |
| 1 1 0 0 0 | 7 | 8 |
| 1 1 0 0 1 | 8 | 8 |
| 0 1 0 0 1 | 8 | 9 |
| 0 1 1 0 1 | 9 | 9 |
| 0 1 1 0 0 | 9 | 0 |

The five bit codes under the Dial Binary Codes heading are the encoded positions of the shaft 82 and pointer 83 relative to the dial numerical markings. The code is read from left to right with the first digit of the code provided at the sensor associated with the sensing position 84A. Accordingly, the second, third, fourth and fifth positions of the digits to the right of the first digit are provided at the sensors associated with the sensing positions 84B, 84C, 84D and 84E, respectively. Either a zero or one indicia sector is positioned adjacent a sensor position to produce the corresponding output. In the solid line position of the pointer 83, pointing to the numeral 0, the code pattern 80 is positioned adjacent the sensor positions in FIG. 4 to produce the code zero, one, one, zero, zero as indicated at the last code under the Dial Binary Codes heading. Under the Decade Dial Reading heading the corresponding dial reading is either 9 under the Low column or 0 under the High column. Thus, the same code is provided when the pointer is immediately approaching or passing one of the dial markings.

Figure 4A:
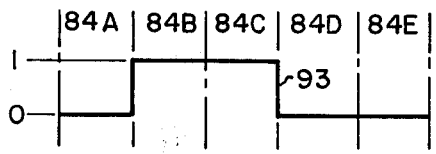
FIG. 4A is a graph of an encoded binary produced by the pattern arrangement shown in FIG. 4.

In FIG. 4A there is illustrated an exemplary binary coded signal 93 that is produced by sensors associated with the sensing positions 84A, 84B, 84C, 84D and 84E with the pattern 80 positioned as in FIG. 4. The binary one and zero signals are produced by positive and zero voltage levels as shown when sensors such as in one of the groups of sensors 61, 62, 63, 64 and 65 of FIG. 1 are sequentially read out or interrogated. The signal 93 has the two-or-three-out-of five code format in accordance with Code Conversion Table hereinabove.

The interdial interpretation portion of the Code Conversion Table indicates that the interpretation for a given dial depends upon the Low or High reading of the next less significant dial, as noted above. For example, taking the dial of FIG. 4 as the hundreds dial and assuming the pointer 83 is rotated clockwise about 3.6° or 10 percent of the distance toward the numeral 1, as shown by the broken line position 83A, the next least significant dial would be the tens dial and it would read one so that the High column would be referred to indicating that the correct interpretation is zero for the hundreds dial. If the pointer 83 is about 3.6° or 10 percent of the distance counterclockwise from the numeral 9, as shown by the broken line position 83B, the tens dial would read nine so that the Low column would be referred to indicate the nine reading for the hundreds dial. Correspondingly, when the code pattern is positioned with the pointer 83 immediately approaching or passing a dial numeral the reading of the next least significant dial is used in accordance with Low and High columns of the Code Conversion Table.

If the pointer 83 is rotated to a position not shown 18° clockwise from the position shown in FIG. 4, the binary code produced would be one, one, one, zero, zero which is provided when the pointer is within nine degrees either side of the reference line 81K midway between the numerals 0 and 1. The first code of the Code Conversion Table indicates that the corresponding dial position is zero. Both the Low and High columns indicate the zero reading and there is no requirement for the interdial interpretation. Correspondingly, when the pointer 83 points to a dial position within the center half arcuate portions adjacent the reference lines 81L, 81M, 81N, 81O, 81P, 81Q, 81R, 81S and 81T there is no need for reference to the next least significant dial for dial interpretation.

Figure 5:
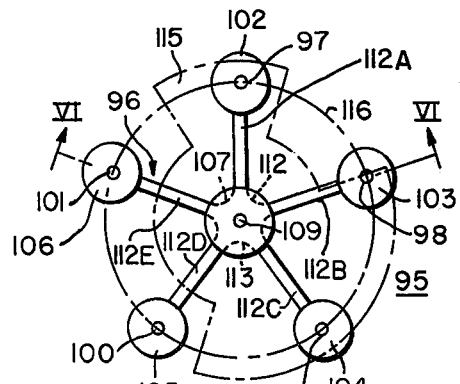
FIG. 5 is a front schematic view looking along the axis of a pointer shaft of an alternative embodiment of the present invention including a magnetic pattern sensing assembly.
Figure 6:
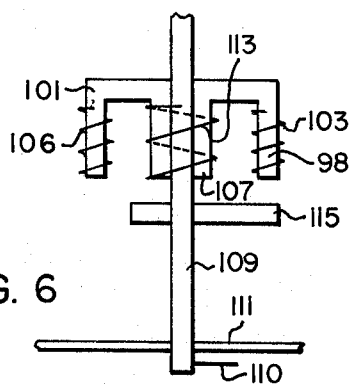
FIG. 6 is a top schematic view of the magnetic sensing assembly shown in FIG. 5.
Figure 7:
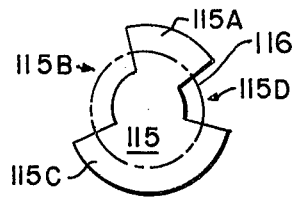
FIG. 7 is a front plan view of a code plate utilized in the assembly shown in FIGS. 5 and 6.

FIGS. 5, 6, and 7 show an alternative pattern sensing assembly 95 of the magnetically responsive type. In FIG. 5 there is shown a front plan view of a magnetic member 96 having five circumferentially disposed magnetic sensor cores 97, 98, 99, 100 and 101 extending along the five sensing positions which are oriented as described hereinabove. Accordingly, the ends of the cores 97, 98, 99, 100 and 101 define the sensing positions 84A, 84B, 84C, 84D and 84E shown in FIG. 4 which are equally circumferentially spaced. These magnetic cores include pick-up coils 102, 103, 104, 105 and 106. The cores 97, 98, 99, 100 and 101 are integrally connected to a center magnetic core 107 having a center bore positioned to receive a pointer shaft 109 carrying a dial pointer 110 in front of a dial plate 111 of the type described hereinabove in the register 18. The magnetic member 96 can be made of a one piece sintered ferrite material in one preferred form with connecting portions 112A, 112B, 112C, 112D and 112E low reluctance magnetic paths between the outer cores 97, 98, 99, 100 and 101 and the center core 107. An exciter coil 113 is wound around inner and center core 107 to provide a source of excitation for the pick-up coils in response to the operation of a magnetic code pattern.

A code plate 115 shown in FIG. 7 has the identical code pattern configuration as described hereinabove. The code plate 115 is made of a soft magnetic material to control the magnetic fields associated with the member 96. A single code track is formed around a circular reference line 116 shown in FIG. 5 of the code plate 115 that is aligned with the ends of the of the cores carrying the pick-up coils 102, 103, 104, 105 and 106. The pattern of plate 115 includes an arcuate and pie-shaped portion 115A including the reference line 116 and which corresponds to the first code segment referred to in connection with the description of the code pattern 80 in FIG. 4, having a segment forming three indicia sensors each providing binary one representations between reference lines 85A and 85R. The second segment of a code plate 115 includes the arcuate gap or open space 115B corresponding to the second code segment of the pattern 80 in which seven zero binary indicia sectors are included. Correspondingly, arcuate and pie-shaped portion 115C and arcuate gap or open space 115D along the line 116 of the plate 115 correspond to the third and fourth segments of the code pattern 80 in which a segment of seven binary ones are included in the portion 115C and three binary zero representations are provided by the gap 115D.

Upon rotation of the pointer shaft 109, the code plate 115 will be positioned, for example as shown in FIG. 5, in which when the portion of the material forming the plate 115, and included in the code track thereof, extends radially adjacent the ends of outer cores 97, 98 and 99 and associated pick-up coils. Magnetic flux from the exciting coil 112 will be coupled to the pick-up coils 102, 103 and 104 through the connecting portions 112A, 112D and 112E produce coil voltage outputs. For example, in FIG. 5, the coils 102, 103 and 104 will have a voltage signal produced, while the coils 105 and 106 will not. The aforementioned shaft and pointer encoded condition corresponds to a binary code signal 11100 or a 0 numerical reading. Each of the positions in which the code pattern formed by the open spaces 115B and 115D of the plate 115 correspond to the opaque areas of the code pattern 80 in which the light from the point light sources is blocked from the light sensors and the open spaces 115B and 115D prevent a completed magnetic flux path between the exciter coil 112 and the pick-up coils associated with each sensor position. The solid areas 115A and 115C of the code plate 115 correspond to the open or transparent portions of the pattern 80 in which light is coupled between the point light sources and the associated light sensors by magnetic flux being coupled between the exciter coil 113 and the pick-up coils in the magnetic sensor arrangement 95.

Figure 8:
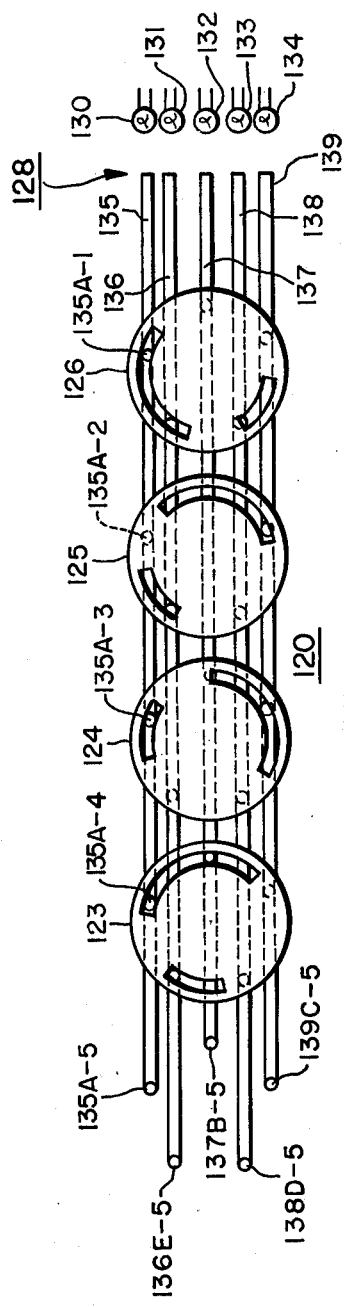
FIG. 8 is a schematic illustration of an alternative optical sensing assembly.
Figure 9:
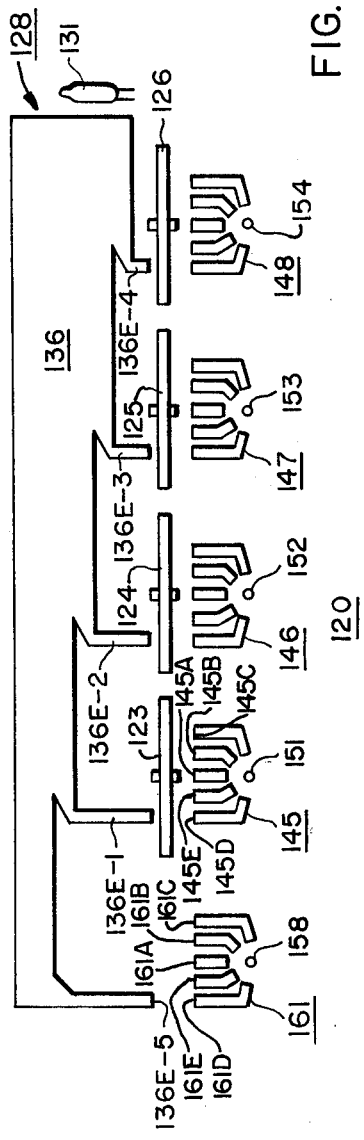
FIG. 9 is a top schematic view of the assembly illustrated in FIG. 8.
Figure 10:
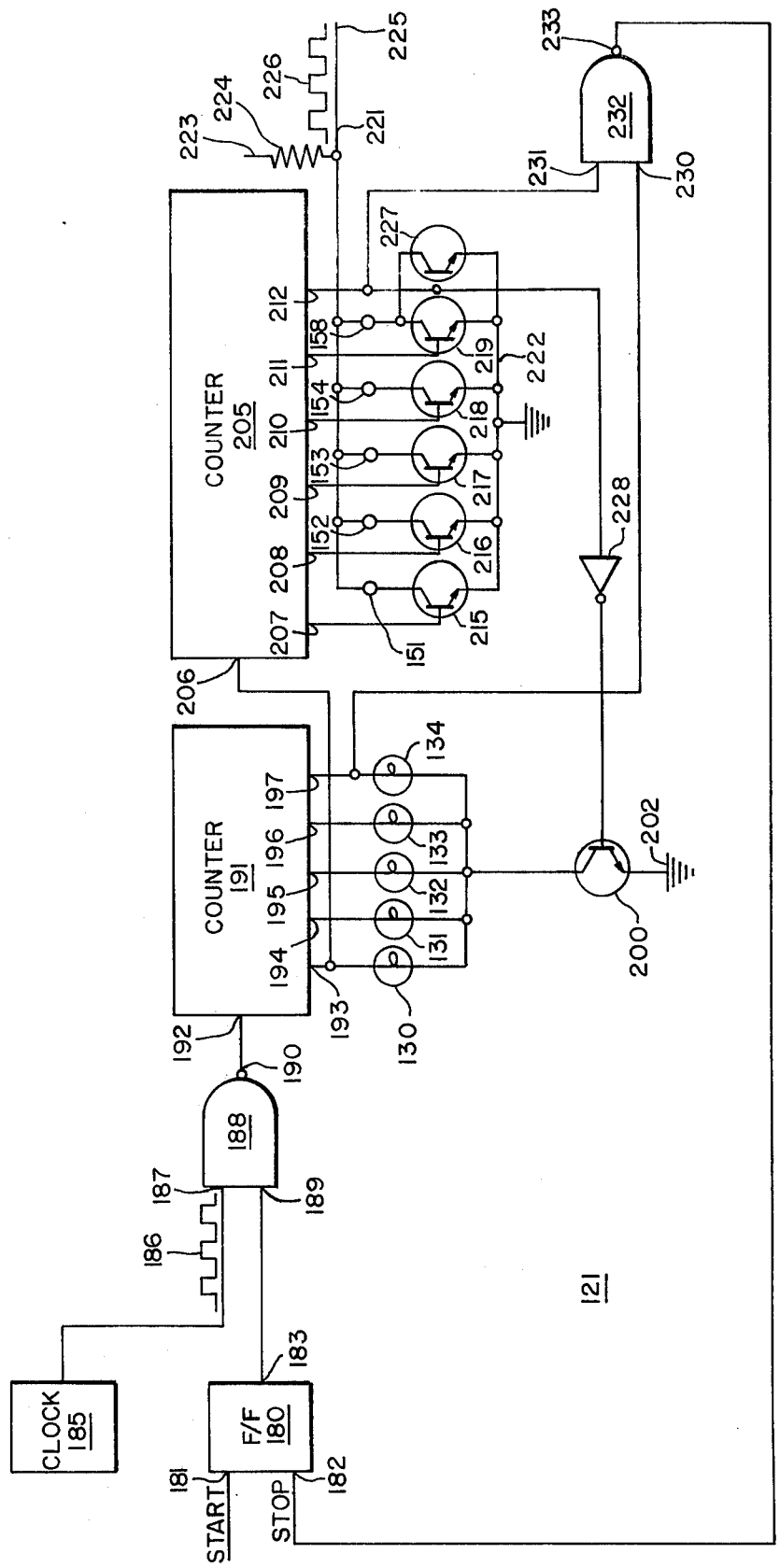
FIG. 10 is an electrical block circuit diagram of an optical sensing control circuit utilized in the sensing assembly illustrated in FIGS. 8 and 9.

Referring now to FIGS. 8 and 9 there is shown another embodiment of a meter dial encoder 120 of the opto-electronic type made in accordance with this invention. FIG. 10 shows an optical sensing control circuit 121 used with the encoder 120 shown in FIGS. 8 an 9. The encoder 120 includes code plates 123, 124, 125 and 126 which correspond to the four code plates 42, 43, 44 and 45 in the encoder 20 of FIG. 1. Only four code plates are shown for a register, it being understood that a fifth code plate for a five dial register or less than four code plates could be utilized in a register embodying the inventive concepts of this invention. A light assembly 128 of the encoder 120 includes five remotely located illuminating sources provided by lamps 130, 131, 132, 133 and 134, each having associated light guides 135, 136, 137, 138 and 139, respectively. Each light guide of the encoder 120 optically couples the light of one lamp to one point light source associated with each of the code plates 123, 124, 125 and 126. Four ends of each light guide are to be positioned at locations corresponding to the point light source locations in the encoder 20 shown in FIG. 1; however, they are reoriented slightly in the clockwise direction to more clearly show the point light locations in FIG. 8. For example, light guide ends 135A-1, 136B-1, 137C-1, 138D-1 and 139E-1 form the point-light sources for the code plate 123. In FIG. 9 the light guide 136 is shown and the guides 135, 137, 138 and 139 are not shown for purposes of simplifying the drawing, it being understood that they are arranged correspondingly. The ends 136E-1, 136E-2, 136E-3, and 136E-4 are shown as they form one of the point light sources for each of the code plates from a single lamp 131. Aligned with the point light sources are five sensing positions equally arcuately spaced as described hereinabove for each code plate. Four groups, each including five light guides, 145, 146, 147, and 148, are arranged so that each group optically couples the sensing positions associated with a code plate to a single light responsive sensor 151, 152, 153 and 154, respectively.

A lamp checking feature is included in the encoder 120. Five additional ends 135A-5, 136E-5, 137B-5, 138D-5 and 139C-5 form five additional point light sources of the light guides 135, 136, 137, 138 and 139 associated with the lamps 130, 131, 132, 133 and 134, respectively. A light responsive sensor 158 is exposed to each of the point light source ends 135A-5, 136E-5, 137B-5, 138D-5 and 139C-5 by a group of light guides designated 161 to conduct light to the sensor 158.

FIG. 10 illustrates the optical scanning control circuit 121 to provide operation of the encoder 120 shown in FIGS. 8 and 9. A bistable flip-flop circuit 180 is provided that is triggered to first output signal condition by a signal applied at a start input 181 thereof. The circuit 180 is triggered to a second output signal condition by an input signal applied to a stop input 182. A flip-flop output 183 provides the first and second output signal conditions.

A clock pulse source 185 produces clock pulses 186 to a first input 87 of an AND gate 188. A second input 189 is connected to the flip-flop output 183 so as to gate clock pulses to the AND gate output 190 when the flip-flop provides the first output signal condition. A five stage counter 191 has a clock input 192 connected to the AND gate output 190. Five counting outputs 193, 194, 195, 196 and 197 are connected in series with the five lamps 130, 131, 132, 133 and 134, respectively, shown in FIG. 9. The counter 191 advances one count at the counting for each complete clock pulse cycle. A switching transistor 200 has the collector-to-emitter circuit connected in series with all of the lamps 130, 131, 132, 33 and 134 and a circuit ground 202. The transistor base biasing circuit is connected to a second counter circuit 205 described hereinafter. When conductive, the transistor 200 completes the connection of the lamps to the circuit ground 202. Accordingly, upon receipt of a start signal at the flip-flop input 181, the lamps 130, 131, 132, 133 and 134 are sequentially lit with each clock pulse from the clock pulse source 185. Pulse signals are produced at the outputs 193, 194, 195, 196 and 197 for consecutive energization of the lamps.

The second counter 205 is a six stage counter having a clock input 206 connected to the first counting input 193 of the counter 191. The counter 205 is triggered after every five clock pulses applied to the counter 191. Six counting outputs 207, 208, 209, 210, 211 and 212 sequentially produce output signals in response to each input signal at the input 206. Five solid state switching devices formed, for example, by transistors 215, 216, 217, 218 and 219 have collector-to-emitter circuits which are connected in series with the light responsive sensors 151, 152, 153, 154 and 158 shown in FIG. 9 and conductors 221 and 222. A source of voltage V is applied to terminal 223 and through resistor 224 to conductor 221. Terminal 225 produces the meter reading encoded pulses 226 which are synchronized with the clock pulses 186 in a suitable manner, not shown. A sixth solid state switching device formed by transistor 227 has a collector-to-emitter circuit connected in parallel with the collector-to-emitter circuit of the transistor 219 and in series with the sensor 158. The counting outputs 207, 208, 209, 210, 211 and 212 are connected to the base input circuits of the transistors 215, 216, 217, 218, 219 and 227, respectively. The output 212 is connected through an inverting circuit 228 to the base of transistor 200. This biases transistor 200 normally conductive and then nonconductive when the transistor 227 is rendered conductive by a signal output from the counting output 212. Accordingly, each signal from the counting outputs separately renders the transistors conductive sequentially after each cycle in which each of the lamps 130, 131, 132, 133 and 134 are lit. The conductive state of the transistors connected to the counter 205 outputs enables the associated light sensor. Encoding of the reading of the pointer shaft associated with the sensor that is enabled occurs with signal from the outputs 207, 208, 209 and 210 while lamp checking functions occur with the signald outputs from the counting outputs 211 and 212 as described hereinbelow.

To terminate a scanning cycle, the counting outputs 197 and 212 of the counters are connected to the inputs 230 and 231 of the AND gate 232. The coincidence of signals at the outputs 197 and 212 produces a signal at the gate output 233. The flip-flop input 182 is connected to the gate output 233 to trigger the flip-flop to the second output signal conduction. This inhibits the gate 188 so that clock pulses 186 are no longer applied to the counter 191.

In operation of the optical sensing control circuit 121, the lamps 130, 131, 132, 133 and 134 and sensors 151, 152, 153, 154, and 158 are sequentially activated to develop the meter reading encoded signals and provide the checking operations of the encoder shown in FIGS. 8 and 9. The circuit 121 is initially inactive with the flip-flop circuit 180 providing the second output signal condition which prevents the clock pulses from being applied to the counter 191. When an encoder output is desired, a signal is applied to the start input 181 to produce the first output signal condition at the flip-flop output 183. The transistor 200 is enabled by the initial state of the counting output 212 as clock pulses are applied to the counter 191. The sensor 151 is initially activated by transistor 215 being rendered conductive. The lamp 130 is lit first to illuminate the light guide 135 and the associated point light source ends, however, only the dial associated with the sensor 151 will be sampled since the other sensors are inactive. The lamps 131, 132, 133 and 134 are sequentially lit thereafter by each clock pulse counted by the counter 191 to also illuminate each of the light guides 136, 137, 138 and 139 and the associated point light sources. Since only the sensor 151 associated with the first dial code plate 123 will be enabled and the positioning of the open areas of the code plate 123 adjacent the sensing positions defined by the ends of the light guides 145A, 145B, 145C, 145D and 145E cause light to be transferred by each radiated light guide to the sensor 151. Each of the first five complete cycles of clock pulses applied defines a single dial scanning and encoding interval. The presence or absence of a pulse produced on the line 221 as the lamps are sequentially lit, depending upon whether the sensor 151 is illuminated by the position of code plate open spaces, establishes binary one and zero encoded signals at the output terminal 225.

The next five clock pulses, first initiate an output from the counting output 193 of the counter 191 to the counter 205 to develop an output at counting output 208. This enables the transistor 216 so that as the five lamps 130, 131, 132, 133 and 134 are again cyclically energized, the sensor 152 samples the position of the code plate with each clock pulse. Thus with each signal developed by the sensor 152 at the output terminal 225, which is coincident with the clock pulses at the AND gate input 188, develops binary one signals. When the code pattern of the code plate blocks light and as a clock pulse occurs a binary zero signal is developed. The encoded signals for the code plates 125 and 126 are similarly developed by the next two sequences of five clock pulses. During these latter two sequences the sensors 153 and then 154 are enabled.

For checking the operative conditions of the lamps 130, 131, 132, 133 and 134, the lamps are lit by the fifth sequence of five clock pulses. The counting output 211 of the counter 205 biases the transistor 219 for conduction at the first of the clock pulses and the lamp checking sensor 158 will receive light from light guides 135, 136, 137, 138 and 139 and the light guides 161A, 161B, 161C, 161D and 161E if all lamps are lit. If during one of the clocking pulses a lamp is not lit there will not be output from the sensor 158 indicating a lamp outage. The next output from the counter 190 triggers the output 212 which renders the transistors 227 conductive. Concurrently, the counting output 212 applies a signal through the inverting circuit 228 to bias the transistor 200 nonconductive. If the sensor 158 is defective by being short circuited which would indicate that all the lamps are lighted during the previous five clock pulses, a signal is produced through the transistor 227. The counting output 212 and counting output 197 signals at the end of the sixth cycle of five clock pulses triggers the flip-flop 180 to stop the scanning cycle of the circuit 121.

Each of the light sensors 151, 152, 153 and 154 must produce a two-or-three-out-of-five code or the code is in error or invalid. Since any single light sensor failure would produce an invalid code, a failure of the light sensor will be detected. A lamp failure will produce an invalid code from one of the code plates two-fifths of the time depending upon the pattern position, so any five dial encoder arrangement will produce a valid five bit code only 7.77% of the time or invalid codes will be reproduced 92.3% of the time. The error detection ability of this arrangement is extended to provide 100% error detection by the provision of the light guides 161 and the light sensor 158. The checking light sensor 158 monitors only the presence of the illuminating radiations from lamps 130, 131, 132, 133 and 134 and is not associated with any of the code patterns. Two extra intervals are added to the code bits associated with the sampling of the dial code plates as controlled by the clock source 185 and counters 191 and 205 in FIG. 10. During the first additional sampling time interval when all of the lamps 134 are activated, the counters 191 and 205 and the light sensor 158 develop outputs on line 221 corresponding to the outputs provided by all five lamps being sequentially lit. During the second added sampling period, all of the lamp sources are off and the sensor 158 produces a dark signal. In this manner the lamps and the checking lamp sensor 158 are both checked for failure. The extended lamp checking arrangement provides a high degree of security against erroneous encoding due to failure of the lamp source and lamp sensor circuits.

While the embodiments described hereinabove are considered preferred, it is contemplated that other alterations and modifications may be provided in accordance with the spirit and scope of this invention.

I claim:

1. An optical meter dial encoder for a multi-dial register driven by a meter movement with each dial having 10 numerical markings, said encoder comprising:

plural pointer shafts each extending through one of said dials, said shafts being interconnected for continuous rotations in a progressively increasing ratio of one-to-10;

plural code discs each including a single circular track pattern wherein each one of the code discs is connected to a separate one of the pointer shafts for continuous rotation therewith, each single track pattern being defined by four alternately opaque and transparent arcuate code segments, the pattern segments being symmetrically disposed so as to commence at angles of 0°, 54°, 108° and 234°, respectively, around each pattern; and an optical pattern sensing assembly including plural groups of five equally circumferentially spaced optical sensing positions with each position having an associated optical sensor, said sensing assembly further including plural groups of five point light sources with each group of sensing positions being in optical communication with both a separate one of said plural patterns and a separate group of point light sources for producing five bit binary coded sensor output signals, each of said four pattern segments defining 20 equally arcuate binary indicia sectors with two of the segments each defining three of the sectors and the remaining two segments each defining seven of the sectors adjacent a group of sensing positions to produce 20 different five bit output signals indicating twenty equally arcuate positions of an associated pointer shaft, said pattern segments being effective to alternately produce said sensor output signals in either a two or a three out of five binary coded format for distinguishing between 10 definite numeral indicating positions of a pointer shaft and 10 intermediate positions thereof, and said pattern segments being further effective to produce a change at only one of the sensors of a group when the associated pattern is moved through angular increments equal to one of the indicia sectors.

2. A meter dial encoder as claimed in claim 1 wherein each of said plural discs is carried on one of said pointer shafts and wherein each disc includes arcuate enclosed slots forming alternate ones of said transparent arcuate code segments.

3. A meter dial encoder as claimed in claim 1 including a light guide means having recessed dimples defining each of said plural groups of point light sources and further including an illuminating source positioned at one side edge of said light guide means.

4. A meter dial encoder as claimed in claim 1 wherein each of said optical sensors is located remotely from said sensing positions and wherein said encoder further includes light guide means for optically communicating said sensing positions with said optical sensors.

* * * * *